(12) United States Patent
Kurd et al.

(10) Patent No.: US 6,505,262 B1
(45) Date of Patent: Jan. 7, 2003

(54) GLITCH PROTECTION AND DETECTION FOR STROBED DATA

(75) Inventors: Nasser A. Kurd, Hillsboro, OR (US); Robert J. Greiner, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/449,627

(22) Filed: Nov. 30, 1999

(51) Int. Cl.$^7$ .............................. H03K 5/22; G06F 13/12

(52) U.S. Cl. ...................................... 710/100; 327/379

(58) Field of Search ........................... 710/100, 34, 62; 327/23, 379, 331, 551; 714/43, 1, 48; 326/21, 22, 31; 365/230.08

(56) References Cited

U.S. PATENT DOCUMENTS

| | | | |
|---|---|---|---|
| 5,982,704 A | * 11/1999 | Kim | |
| 6,016,066 A | 1/2000 | Ilkbahar | |
| 6,055,587 A | * 4/2000 | Asami et al. | |
| 6,377,097 B1 | * 4/2002 | Shuler, Jr. | |

* cited by examiner

Primary Examiner—Gopal C. Ray
(74) Attorney, Agent, or Firm—Kenyon & Kenyon (57) ABSTRACT

In a processing system, a glitch protection circuit receives a strobe signal and a data receiver captures a data signal in response to an output from the glitch protection circuit. Several embodiments are disclosed. In a first embodiment, a glitch protection circuit generates an output that represents a logical multiplication of a strobe signal with a delayed version of itself. In another embodiment, a pair of glitch protection circuits each sense a strobe transition and become dormant until its partner senses a strobe transition. The pair operates in a toggling fashion.

20 Claims, 6 Drawing Sheets

GLITCH PROTECTION AND DETECTION FOR STROBED DATA

BACKGROUND OF THE INVENTION

The present invention relates to a scheme for detecting and correcting random glitches that can cause erroneous capture of strobed data in a computing system.

Figure 1:
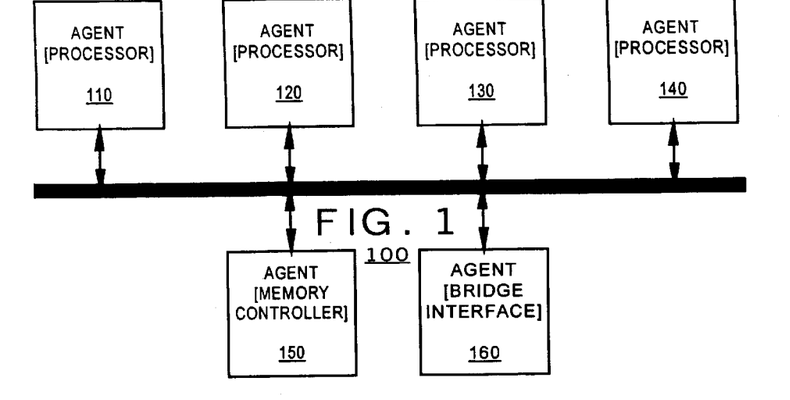
FIG. 1 is a block diagram of a conventional computing system.

FIG. 1 illustrates a modern computing system in which a plurality of agents 110–160 exchange data over a communication bus 170. An "agent" can be any component of the computing system that can transmit or receive data via the communication bus. Conventional agents include processors, memory controllers, peripheral devices, bus interface units, digital signal processors and, possibly, application specific integrated circuits. While the architectures and protocols used by communications buses may vary, each typically achieves a data transfer when a first agent drives electrical signals representing the data on the communication bus 170 and a second agent captures the signals.

Figure 2:
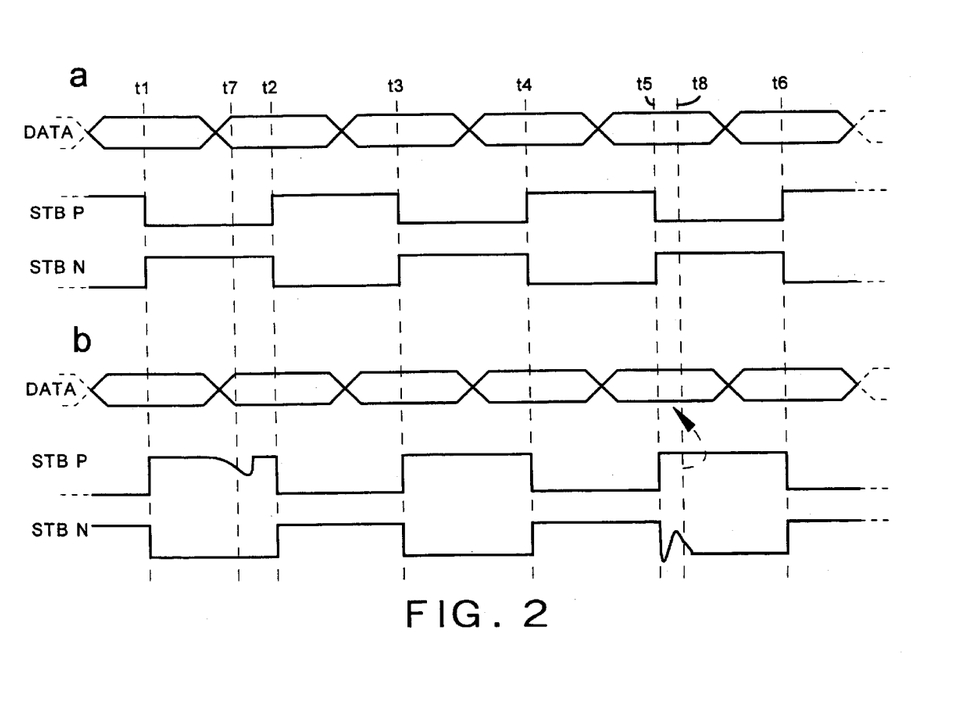
FIG. 2 is a timing diagram illustrating the problems of the prior art.

"Strobed data" refers to a manner of driving electrical data signals on the communication bus 170. As illustrated in FIG. 2, data may be driven on a communication bus during data windows, each having a predetermined duration. At the conclusion of each of these data windows, the data is changed to set up for a succeeding data window. While the onset of the each data window is known, it cannot be guaranteed that the data for a particular data window will be stable at the onset. Variations in propagation distances along the communication bus and variations in bus design can affect the time that it takes to establish valid data at a data receiver. Thus, the timing of the data window at a receiving agent may differ from the timing of the same data window at a transmitting agent.

A strobed data bus accommodates for these variations by having the driving agent generate a strobe signal, typically in the middle of the data window. A receiving agent captures data when it detects a predetermined change in the strobe signal. Strobed data buses are advantageous because the variances in propagation distance and bus design that affect the timing of data signals also should be replicated in the strobe signal. Valid data should be present at the receiving agent when the receiving agent receives the strobe.

FIG. 2, on graph (a), illustrates an example of a dual strobe system. Each driving agent generates two differential strobe signals, STB P and STB N. The strobe signals are the same signal but delayed with respect to each other by the duration of a data window. In the example of FIG. 1, a receiving agent captures data when either strobe signal crosses a predetermined threshold as it transitions from a high state to a low state. Thus, data would be captured at times $t_1$–$t_6$. Other strobe systems are known.

Strobe signals can be subject to glitches. Glitches represent random voltage changes in a signal that are caused for various well-known reasons, including voltage spikes, ring-backs, ground bounces, power sag and cross-talk. When glitches occur on a strobe signal, they are fatal to system operation because they cause a receiving agent to capture invalid data. For example, glitches are shown in graph (b) of FIG. 2, occurring at times $t_7$ and $t_8$. At time $t_7$, the glitch would cause a receiving agent to capture data even though erroneous data may be present on the bus. At time $t_8$, a glitch causes a "double capture" of valid data. The capture of a second copy of valid data at time $t_8$ causes system failure in the same way as the capture of invalid data at time $t_5$.

Accordingly, it is desired in the art to protect receiving agents from glitches that may occur in strobe signals. There is a need in the art to provide glitch correction systems in receiving agents. Further there is a need in the art to provide glitch detection systems in receiving agents that identify the occurrence of a glitch that cannot be corrected.

SUMMARY

Embodiments of the present invention provide an agent for a processing system, in which a glitch protection circuit receives a strobe signal and a data receiver captures a data signal in response to an output from the glitch protection circuit.

DETAILED DESCRIPTION

Embodiments of the present invention provide a glitch protection system for data receivers that corrects glitches that may occur on strobe signals and/or detects uncorrectable glitches.

Figure 3:
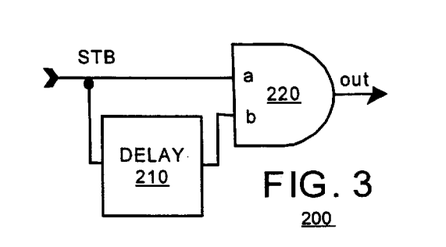
FIG. 3 is a block diagram of a glitch protection circuit according to an embodiment of the present invention.

FIG. 3 is a block diagram of a glitch protector 200 constructed according to an embodiment of the present invention. The glitch protector 200 protects against voltage spikes and other short glitches that may occur on a strobe signal. The glitch protector 200 may be populated by a delay circuit 210 and an AND gate 220. A strobe signal STB from the communication bus (not shown) may be input to the delay circuit 210 and to the AND gate 220. An output of the delay circuit 210 also may be input to the AND gate 220. Thus, the AND gate 220 generates an output that is the logical multiplication of the strobe signal STB with a delayed version of itself. The output of the glitch protector 200 may be input to a conventional receiver of an agent (not shown).

Figure 4:
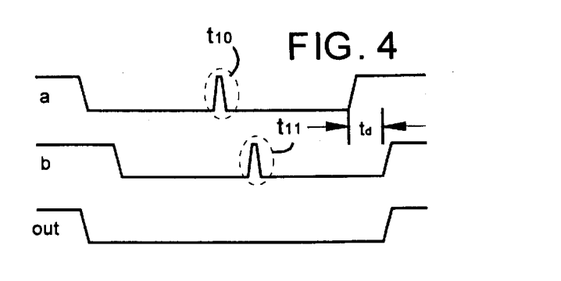
FIG. 4 is a timing diagram of a glitch protection circuit according to an embodiment of the present invention.

FIG. 4 illustrates operation of the glitch protector 200 in response to a glitch that occurs during a strobe. Signal line a illustrates, at time $t_{10}$, a glitch that input to the a terminal of the AND gate 220 (FIG. 3). The glitch propagates through the delay block 210 and is input to the b terminal of the AND gate 220 at time $t_{11}$. Neither glitch occurs on the output of the AND gate 220; it is effectively filtered out of the strobe signal. So long as the glitch does not have a duration that exceeds the delay of the delay block 210, the glitch protector 200 will filter the glitch from the strobe signal.

Figure 5:
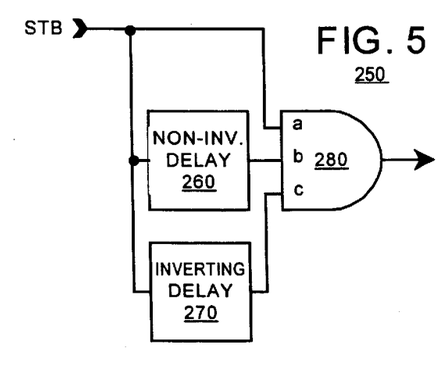
FIG. 5 is a block diagram of a glitch protection circuit according to an additional embodiment of the present invention.

FIG. 5 illustrates a glitch protector 250 constructed in accordance with another embodiment of the present invention. There, the glitch protector 250 may include a non-inverting delay block 260, an inverting delay block 270 and an AND gate 280. The non-inverting delay block 260 is characterized by a first delay period $t_{d1}$. The inverting delay block 270 is characterized by a second delay period $t_{d2}$ that is longer than the first delay period. The STB signal and the outputs from both delay blocks 260, 270 are input to the AND gate 280. An output from the AND gate 280 is output from the glitch protector.

Figure 6:
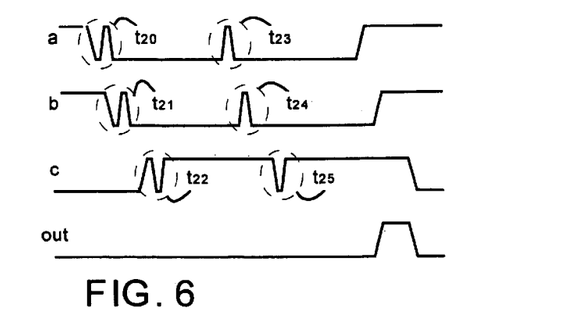
FIG. 6 is a timing diagram of a glitch protection circuit according to an embodiment of the present invention.

FIG. 6 illustrates operation of the glitch protector 250 in response to two glitches. Signal lines a, b and c correspond to the three inputs to the AND gate 280. Initially, the STB signal is shown as active—Inputs a and b to the AND gate are active while input c is inactive. Thus, the output of the AND gate 280 is inactive. A first glitch occurs at time $t_{20}$ at the falling edge of the STB signal. It is input directly to the AND gate 280 on input a. The glitch is output from the first delay block 260 at time $t_{21}$ and is input to the AND gate 280 on input b. The glitch is inverted and output from the second delay block 270 at time $t_{22}$. The falling edge glitch is masked entirely from the output of the glitch protector 280.

FIG. 6 also illustrates a second glitch occurring toward the middle of the inactive period of the STB signal. This glitch corresponds to the glitch shown in FIG. 4 above. As with the embodiment of FIG. 3, the glitch protector 250 filters this glitch from the output strobe signal.

As shown in the OUT signal line of FIG. 6, the glitch protector 250 of FIG. 5 generates a pulsed strobe signal having a width determined by the difference between $t_{d1}$ and $t_{d2}$. The pulsed strobe signal typically is appropriate for use by data receivers.

Embodiments of the delay blocks described herein with respect to FIGS. 3 and 5 may be populated by one or more Schmitt-triggered elements. Schmitt-triggered elements tend to be unresponsive to transient glitch signals and, therefore, may provide further protection against glitch signals.

Figure 7:
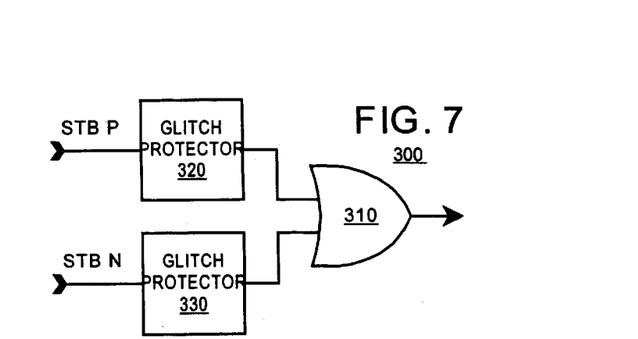
FIG. 7 is a block diagram of a glitch protection circuit according to another embodiment of the present invention.

FIG. 7 is a block diagram of a glitch protector 300 constructed in accordance with an additional embodiment of the present invention. The glitch protector 300 may be populated by an OR gate 310 and multiple glitch protector "cells" 320, 330. The glitch protector 300 is shown for use with a pair of strobe signals, STB P and STP N. The glitch protector cells 320, 330 may be constructed according to one of the embodiments of FIGS. 3 or 5. Outputs from the glitch protector cells 320, 330 are input to the OR gate 310. In this embodiment, the strobe signals STB P and STB N are made subject to glitch protection and merged thereafter into a unitary strobe signal for use by a data receiver (not shown).

Figure 8:
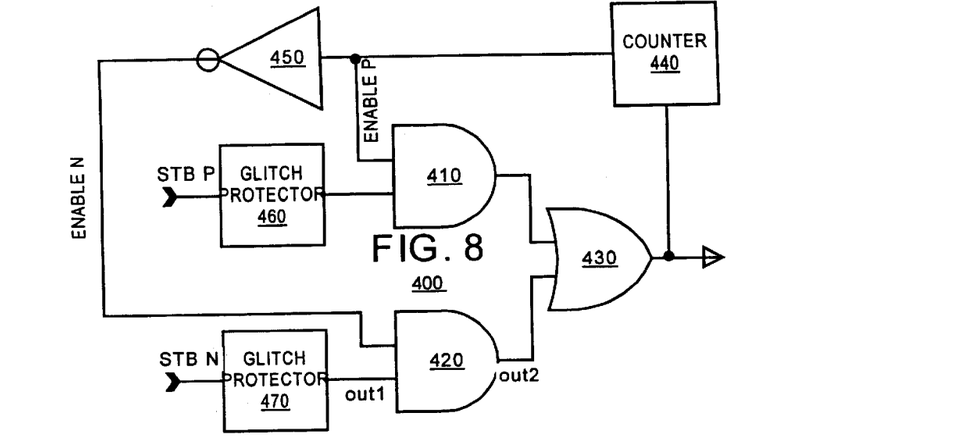
FIG. 8 is a block diagram of a glitch protection circuit according to a further embodiment of the present invention.

FIG. 8 illustrates a glitch protector 400 constructed according to another embodiment of the present invention. The glitch protector 400 may be populated by an OR gate 430, a counter 440, an inverter 450 and multiple glitch protection cells 460, 470.

The glitch protection cells 460, 470 may be constructed according to one of the embodiments of FIG. 3 or 5. Outputs of the first and second glitch protection cells 460, 470 may be input to respective first and second AND gates 410, 420. The AND gates 410, 420 also receive respective enable signals, "enable p" and "enable n", on second inputs thereof. Outputs of the first and second AND gates 410, 420 are input to the OR gate 430. An output of the OR gate 430 may be input to a conventional receiver of an agent (not shown).

The output of the OR gate 430 also may be input to the counter 440. The counter 440 generates an output signal based on the least significant bit of the count. It toggles in response to pulses output from the OR gate 430. The output of the counter 440 is input to the first AND gate 410 as the enable p signal. The output of the counter 440 is inverted by the inverter 450 and is input to the second AND gate 420 as the enable n signal.

Figure 9:
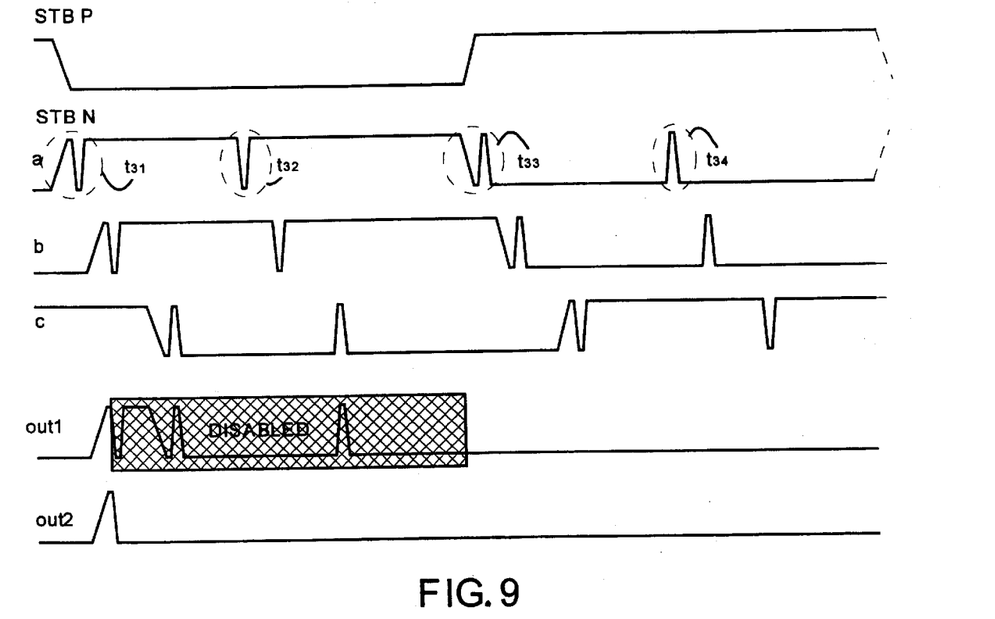
FIG. 9 illustrates operation of a glitch protector according to an embodiment of the present invention.

FIG. 9 illustrates operation of the glitch protector 400. FIG. 9 illustrates differential strobe signals STB P and STB N. STP N is shown with four glitches: A glitch at the rising edge of the STB N signal ($t_{31}$), a glitch during the steady-state active period of the STB N signal ($t_{32}$), a glitch during the falling edge of the STB N signal ($t_{33}$) and a glitch during the steady-state inactive period of the STB N signal ($t_{34}$). Signal lines a, b and c correspond to inputs a, b, and c at AND gate internally within the glitch protector 470 (assuming the glitch protector of FIG. 5 were used for glitch protector 470). Signal line $out_1$ demonstrates the output of the glitch protector 470. As will be observed, the glitches at times $t_{31}$ and $t_{32}$ are reflected in the $out_1$ signal.

In response to the rising edge of the $out_1$ signal, the counter 440 (FIG. 8) advances and the enable n signal deactivates the AND gate 420. Thus, although the glitches from times $t_{31}$ and $t_{32}$ advance from the glitch protection cell 470 to the AND gate 420, they do not advance further than the AND gate 420. The enable signals (enable p and enable n) prevent these glitches from propagating into a data receiver.

Figure 10:
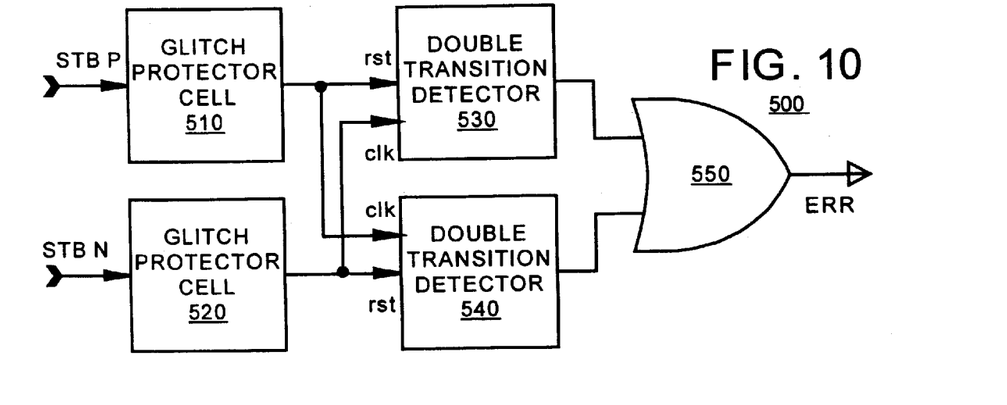
FIG. 10 is a block diagram of a glitch detection circuit according to an embodiment of the present invention.

FIG. 10 illustrates a glitch detector circuit 500 constructed according to an embodiment of the present invention. The glitch detector 500 may be populated by a plurality of glitch protection cells (labeled 510 and 520), a pair of double transition detectors 530, 540 and an OR gate 550. The glitch detector 500 generates an error signal in the event one or more of the glitch protectors fail to correct a glitch.

The glitch protection cells 510, 520 may operate according to the previous embodiments, generating an output representing a respective strobe signal (STB P or STB N) logically multiplied with a delayed version of itself. The outputs of each glitch protection cell 510, 520 are input to respective double transition detectors 530, 540. In response to pulses received from its associated glitch protection cell 510, the double transition detector 530 increments its count of transitions. The double transition detector 530 also receives output from the complementary glitch protection cell 520 and, responsive to pulses received therefrom, either clears or decrements its count of pulses. During normal operation, in the absence of glitches, every pair of pulses from glitch protection circuit 510 should be interrupted by a pulse from the other glitch protection circuit 520 and vice versa. Thus, neither double transition detector should ever reach a count greater than 1.

Each double transition detector 530, 540 generates an output representing the value of the second least significant bit maintained in its counter. Thus, if any double transition detector (say, 530) counts to a value greater than 1, the double transition detector 530 will activate its output and the glitch detection circuit 500 will generate an error signal.

According to an embodiment, the double transition detectors 530, 540 may be divided-by-two counters.

FIG. 10 also illustrates a second OR gate 550 coupled to outputs of the glitch protector cells 510, 520. An output of the second OR gate may be input to a data receiver (not shown).

Figure 11:
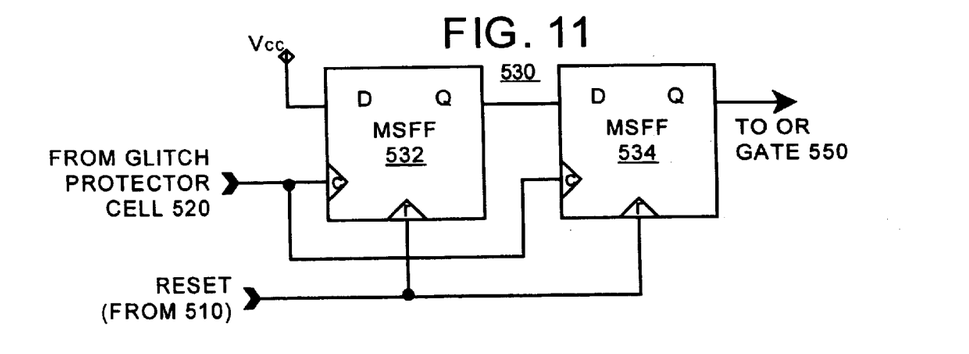
FIG. 11 is a block diagram of a double-transition detector according to an embodiment of the present invention.

FIG. 11 illustrates a double transition detector 530 according to an embodiment of the present invention. The detector 530 may include a pair of cascaded master-slave flip-flops (MSFF) 532, 534. Vcc may be input to the first MSFF 532 at a D terminal thereof. A Q output of the first MSFF 532 is input to a D input of the second MSFF 534. A Q output of the second MSFF 534 is output from the double transition detector 530. An output from the first glitch protection cell 510 may be input to clocking inputs of the first and second MSFFs 532, 534. An output from the second glitch protection cell 520 may be input to resetting inputs of the first and second MSFFs 532, 534.

Figure 12:
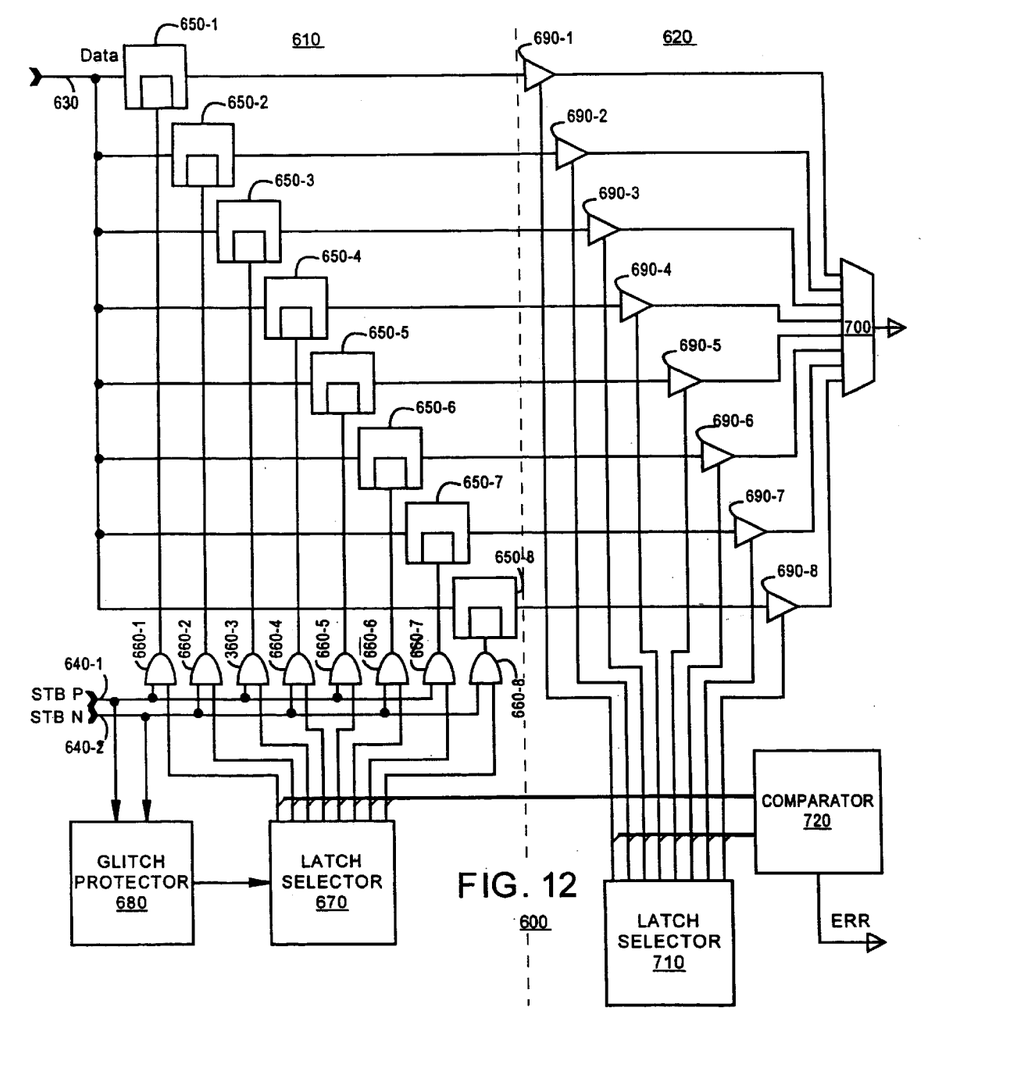
FIG. 12 is a block diagram of an exemplary data receiver according to an embodiment of the present invention.

FIG. 12 illustrates a data receiver 600 of an agent constructed in accordance with an embodiment of the present invention. The data receiver 600 may include two functional elements: a data capture circuit 610 and a data drain circuit 620. The data capture circuit 610 captures data from the communication bus (FIG. 1) and buffers the data. The data drain circuit 620 reads the buffered data to other components within the agent.

The data capture circuit 610 may include a data input terminal 630, one or more strobe input terminals 640-1, 640-2, a plurality of data latches 650-1 through 650-8, a plurality of latch enablers 660-1 through 660-8, a latch selector 670 and a glitch detector 680.

The data latches 650-1 through 650-8 each are provided in communication with the data input terminal 630 which, in turn, is provided in communication with the external communication bus (FIG. 1). Each data latch (say, 650-1) is enabled by a respective latch enabler 660-1. Each latch enabler (say, 660-1) is controlled by a strobe signal (STB P) and by the latch selector 670. In the embodiment of FIG. 12, the latch enabler 660-1 is shown as an AND gate.

FIG. 12 illustrates a dual-strobe embodiment. In this embodiment, a pair of strobe signals STB P and STB N controls the data receiver 600. The STB P signal from terminal 640-1 is input to every other latch enabler 660-1, 660-3, 660-5 and 660-7; the STB N signal from terminal 640-2 is input to the remaining latch enablers 660-2, 660-4, 660-6 and 660-8. However, the data receiver 600 could be integrated with a single strobe design; in such a case, the strobe signal would be input to each of the latch selectors.

The strobe signals also are input to the glitch protection circuit 680. The protection circuit detector 680 generates a pulsed output to the latch selector 670. The latch selector 670 generates an active selection signal on only one of the outputs to the latch enablers 660-1 through 660-8. In response to a pulse from the glitch protection circuit 680 the latch selector 670 advances the selection signal to a next latch in sequence. Thus, the selector signal cycles throughout the latch enablers 650-1 through 650-8 (and, thus, the data latches 650-1 through 650-8) in response to pulses from the glitch protection circuit 680. By way of example, the latch selector 670 may be a shift register or a ring counter.

According to an embodiment of the present invention, a data latch 650-1 opens (it receives data) and when the latch selector 670 is pointed to the associated latch enabler 660-1 and when the strobe signal input to the latch enabler 660-1 is active (STB P is logical 1). The latch closes when the strobe deactivates and/or the latch selector 670 advances to the next latch enabler 660-2.

The data capture circuit 610 typically operates at a clock speed for bus systems.

The data drain circuit 620 may be populated by a plurality of buffers 690-1 through 690-8, one for each of the data latches 650-1 through 650-8. Outputs from the buffers 690-1 through 690-8 may be input to a selection multiplexer 700 ("MUX"). An output of the MUX 700 is output from the data receiver 600 further to the agent. The data drain circuit 620 also may include a second latch selector 710. The second latch selector 710 controls each of the buffers 690-1 through 690-8. The second latch selector 710 also may control the MUX 700 either directly or via an optional encoder (not shown). Thus, the second latch selector 710 selects which of the data latches 650-1 through 650-8 drive the output of the MUX 700 by controlling the buffers 690-1 through 690-8 and the MUX 700. Typically, the second latch selector 710 is controlled by an externally supplied control signal (not shown) provided from some other part of the agent.

The data drain circuit 620 may operate at clock speeds that are used within the agent; clock speeds that typically are much faster than the speed of the external communication bus.

The data receiver 600 may include a comparator 720. The comparator 720 receives the selection signals from the latch selector 670 and from the buffer selector 710. The comparator 720 generates an active output whenever the signals from the latch selector 670 and the buffer selector 710 are not equal.

The data receiver 600 provides an additional type of glitch detection. It detects multiple captures of data (See FIG. 1, $t_5$ and $t_8$) by comparing the latch selection signals from the first latch selector 670 and the latch selection signals from the second latch selector 710. An error is detected if the latch selection signals are different when the data receiver should be empty, such as when all data for a bus transaction has been read out of the data receiver 600.

The data receiver 600 may coordinate with other units within an agent to determine a time when to poll the comparator 720. For example, a bus interface unit, a known component in many agents, typically monitors activity on the bus and also causes data to be drained from the data receivers. The bus-sequencing unit may determine from the state of the communication bus and from the data that has been drained from the data receiver 600 that the data receiver 600 should be empty. It samples the output from the comparator 720 and, if the output is active, identifies a glitch error.

Figure 13:
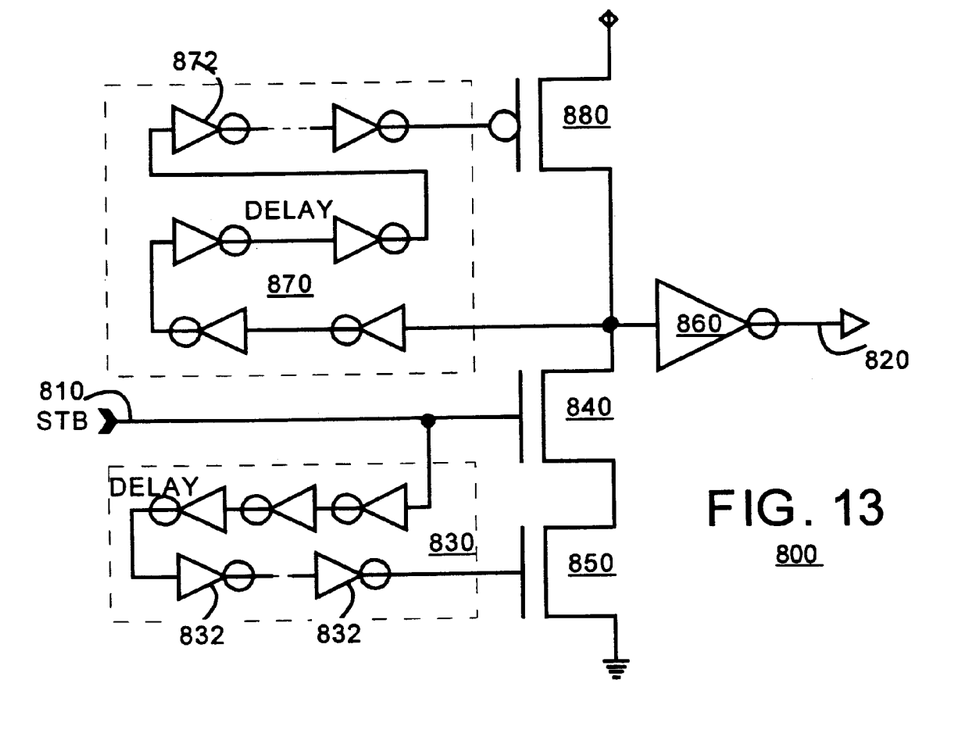
FIG. 13 is a block diagram of a self-resetting AND gate according to an embodiment of the present invention.

FIG. 13 illustrates a self-resetting AND gate 800 suitable for use with the various embodiments described above. The AND gate 800 may include an input terminal 810 for the STB signal and an output terminal 820. A delay block 830 is shown as a series of cascaded inverting buffers 832. The AND gate 800 may include a plurality of pull-down transistors 840, 850 connected in series. The STB signal may be input to the gate of a first pull-down transistor 840 and an output from the delay block 830 may be input to a second pull-down transistor 850.

According to an embodiment, to provide additional glitch protection, one or more of the inventor buffers 832 may be provided as Schmitt-triggered inverter buffers. Schmitt-triggered buffers tend to be unresponsive to transient glitch signals.

The source of a first pull-down transistor may coupled to an inverter 860. An output of the inverter 860 may be output from the AND gate 800 via the output terminal 820.

The AND gate 800 may include a reset circuit that includes a second delay block 870 and a pull-up transistor 880. The pull-up transistor 880 couples the input to the inverter 860 to V$_{cc}$ via a source to drain path. A gate of the pull-up transistor 880 is coupled to an output from the second delay block 870. The second delay block 870 may include a cascaded series of inverter buffers 872. An input of the delay block 870 is coupled to the input of the inverter 860.

To generate an active output on the output terminal 820, the inverter 860 must activate. The inverter activates when its input becomes grounded. Hence, during normal operation, both pull-down transistors 840 and 850 become conductive, thereby grounding the input of the inverter 860. At some time later, after one or both of the pull-down transistors 840, 850 cease to be conductive, the pull-up transistor 880 becomes conductive, returning the input of the inverter to V$_{cc}$ and deactivating the output 820 of the AND gate 800.

The number of inverter buffers 832 in the first delay block 830 determines the width of glitch signals that should be filtered by the glitch protection circuit. This number may be tuned to fit the application and environment in which the agent and the glitch protection circuit are to be used.

The number of inverter buffers 872 in the second delay block 870 determines the width of the pulse that is output from the AND gate 800, a period measured from the time the input of the inverter 860 becomes grounded to the time that the pull-up transistor 880 becomes conductive. This width may be tuned as desired during circuit design.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A method of capturing data from a communication bus comprising:

receiving a strobe signal from the communication bus, generating a filtered strobe signal representing a logical multiplication of the strobe signal with a delayed version of itself, and capturing data from the communication bus in response to the filtered strobe signal.

2. A method of capturing data from a data bus, comprising:

receiving a pair of complementary strobe signals from the data bus, in response to a transition on a first strobe signal, capturing data from the data bus and, thereafter, disabling capturing in response to the first strobe signal until a transition occurs on the second strobe signal.

3. The method of claim 2, further comprising:

capturing data from the bus in response to a transition on a second strobe signal and, thereafter, disabling capturing in response to the second strobe signal until a transition occurs on the first strobe signal.

4. In a dual strobe data system, a method of detecting strobe glitches, comprising:

in response to a predetermined transition on a first strobe signal, incrementing a count of the first strobe signal and clearing a count of a second strobe signal, in response to a predetermined transition on the second strobe signal, incrementing a count of the second strobe signal and clearing a count of the first strobe signal, and if a count of the first or second strobe signals is greater than 1, generating an error signal identifying a strobe glitch.

5. A method of detecting strobe glitches in a data receiver, comprising:

reading a first number of items from a communication bus into the data receiver in response to strobe signals, reading a second number of items out of the data receiver, and at the conclusion of the second reading step, if the first number does not equal the second number, generating an error signal identifying a strobe glitch.

6. An agent for a processing system, comprising:

a glitch protection circuit to receive a strobe signal, and the glitch protection circuit comprising:

a delay circuit to receive the strobe signal at an input thereof, and an AND gate to receive the strobe signal at a first input thereof and receiving an output from the delay circuit at a second input thereof, and a data receiver to receive a data signal, the data receiver controlled by an output from the glitch protection circuit.

7. The agent of claim 6, further comprising another delay circuit to receive the strobe signal at an input thereof and having an output coupled to the AND gate, wherein one of the delay circuits is an inverting delay element and the other of the delay circuits is a non-inverting delay element.

8. The agent of claim 7, wherein the non-inverting delay element has a longer time delay characteristic than the inverting delay element.

9. An agent for a processing system, comprising:

a glitch protection circuit to receive a strobe signal, and a data receiver to receive a data signal, the data receiver controlled by an output from the glitch protection circuit and comprising:

a plurality of data latches to receive the data signal, a latch selector, controlled by the output from the glitch protection circuit, and a plurality of latch enablers, one for each data latch, each controlled by the latch selector and the output of the glitch protection circuit.

10. An agent for a processing system comprising:

a glitch protection circuit to receive a pair of strobe signals, comprising a pair of glitch protection cells, one for each strobe signal, each cell comprising:

a delay circuit to receive a respective strobe signal, and an AND gate to receive the respective strobe signal and an output from the delay circuit, and a data receiver to receive a data signal, the data receiver controlled by an output from the glitch protection circuit.

11. The agent of claim 10, wherein the glitch protection circuit comprises a toggle counter in communication with the glitch protection cells, an output of the toggle counter to disable selectively one of the glitch protection cells.

12. The agent of claim 11, wherein the glitch protection circuit further comprises:

a first AND gate in communication with the first glitch protection cell and the toggle counter, an inverter in communication with the toggle counter, and a second AND gate in communication with the second glitch protection cell and the inverter.

13. A glitch detection circuit comprising:

a pair of glitch protection cells, each to receive a respective strobe signal, and a pair of double transition detectors, one associated with each glitch protection cell, each provided in communication with the respective glitch protection cell and to generate an output if at least two pulses are output from its associated glitch protection circuit without an intervening pulse from the other glitch protection circuit.

14. In the glitch detection circuit of claim 13, a double transition detector comprising a pair of cascaded flip-flops, wherein:

a data input terminal of the first flip-flop is coupled to a predetermined potential, clocking inputs of the flip-flops are coupled to the associated glitch protection circuit, and resetting inputs of the flip-flops are coupled to the other glitch protection circuit.

15. A data receiver, comprising:

a plurality of data latches to receive data from a communication bus, a latch selector, a plurality of latch enablers, one for each data latch, each controlled by the latch selector, a data drain circuit in communication with the data latches, the data drain circuit including a second latch selector, and a comparator in communication with both latch selectors.

16. The data receiver of claim 15, further comprising a glitch protection circuit to receive a strobe signal from the communication bus, the glitch protection circuit to control the first latch selector.

17. The data receiver of claim 16, wherein the glitch protection comprises a delay block and AND gate, the delay block and AND gate each coupled to the strobe signal as inputs, the AND gate additionally coupled to an output of the delay block.

18. A glitch protection circuit, comprising:

an input terminal for a strobe signal, a delay circuit coupled to the input terminal, and an AND gate coupled to the input terminal and to the delay circuit.

19. A computer system, comprising:

a plurality of agents interconnected by a common bus, at least one agent comprising:

a glitch protection circuit to receive a strobe signal generated by another of the agents and to generate an output signal representing a logical multiplication of the strobe signal with a delayed version of itself, and a data receiver to receive a data signal generated by the other agent, the data receiver controlled by an output from the glitch protection circuit.

20. The computer system of claim 19, wherein another of the agents is a source of the strobe signal.

* * * * *